US008861560B2

(12) United States Patent
Nedovic et al.

(10) Patent No.: US 8,861,560 B2

(45) Date of Patent: Oct. 14, 2014

(54) VERTICAL-CAVITY SURFACE-EMITTING LASER DRIVER WITH IMPROVED OUTPUT IMPEDANCE

(71) Applicant: Fujitsu Limited, Kanagawa (JP)

(72) Inventors: Nikola Nedovic, San Jose, CA (US); Tony Shuo-Chun Kao, Sunnyvale, CA (US)

(73) Assignee: Fujitsu Limited, Kawasaki-shi (JP)

( * ) Notice: Subject to any disclaimer, the term of this patent is extended or adjusted under 35 U.S.C. 154(b) by 161 days.

(21) Appl. No.: 13/670,294

(22) Filed: Nov. 6, 2012

(65) Prior Publication Data

US 2014/0126595 A1 May 8, 2014

(51) Int. Cl.
*H01S 3/00* (2006.01)

(52) U.S. Cl.
USPC .................................... 372/38.02; 372/38.03

(58) Field of Classification Search
USPC ................ 372/26, 29.01, 38.02, 38.03, 38.07
See application file for complete search history.

(56) References Cited

U.S. PATENT DOCUMENTS 5,883,910 A 3/1999 Link
6,980,575 B1 12/2005 Rohilla

OTHER PUBLICATIONS

Kucharski, D. et al., "A 20 Gb/s VCSEL driver with pre-emphasis and regulated output impedance in 0.13 Jlm CMOS," *Solid-State Circuits Conference, 2005, Digest of Technical Papers. ISSCC. 2005 IEEE International*, vol. I, 10-10 Feb, pp. 222-594, Feb. 2005.

*Primary Examiner* — Armando Rodriguez

(74) *Attorney, Agent, or Firm* — Baker Botts L.L.P.

(57) ABSTRACT

In one embodiment, a driver circuit of a vertical-cavity surface-emitting laser (VCSEL) includes bias current sources, modulation current sources, and a switch component connected to the bias current sources at a first node and to the modulation current sources at second nodes; the switch component is configured to modulate a current from the bias and modulation current sources based on an input signal to the switch component; and the switch component is also configured to provide the modulated current to the VCSEL through a folded cascode transistor.

20 Claims, 9 Drawing Sheets

VERTICAL-CAVITY SURFACE-EMITTING LASER DRIVER WITH IMPROVED OUTPUT IMPEDANCE

TECHNICAL FIELD

This disclosure generally relates to high-speed circuits.

BACKGROUND

Vertical-cavity surface-emitting laser (VCSEL) is a semiconductor diode device that emits a laser beam perpendicularly from the device's top surface. VCSEL is commonly used for optical fiber data transmission.

SUMMARY

Particular embodiments relate to including a folded cascode transistor in a driver of a vertical-cavity surface emitting laser to improve the driver's output impedance. The object and advantages of the invention will be realized and attained at least by the elements, features, and combinations particularly pointed out in the claims. It is to be understood that both the foregoing general description and the following detailed description are exemplary and explanatory and are not restrictive of the invention, as claimed.

DESCRIPTION OF EXAMPLE EMBODIMENTS

Figure 1:
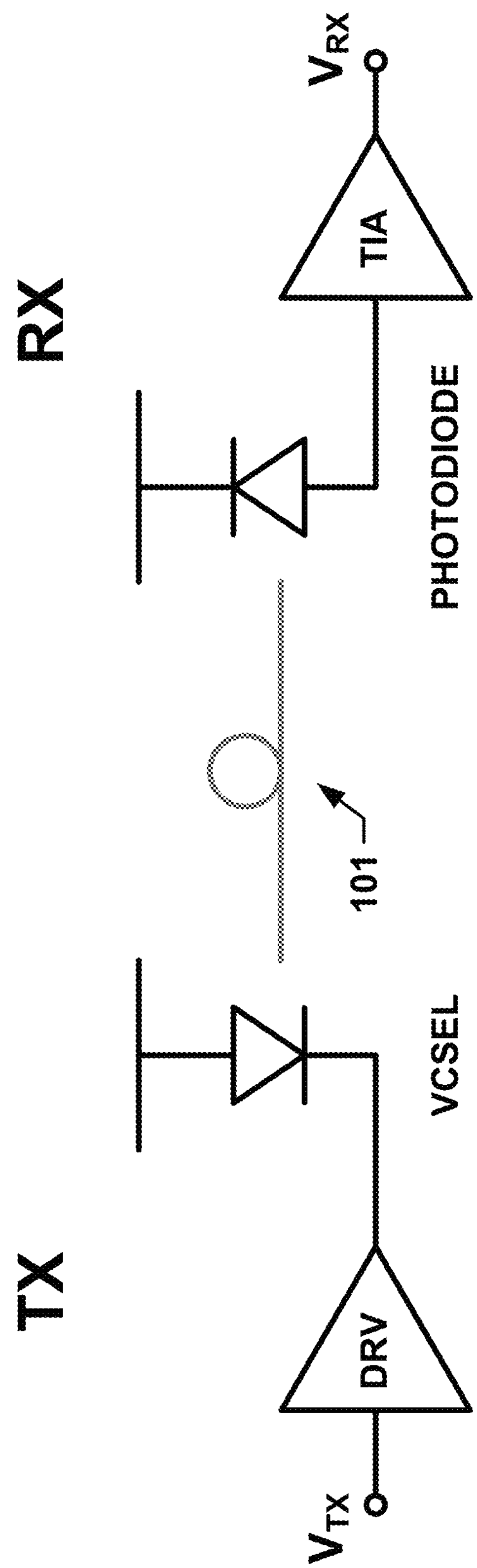
FIG. 1 illustrates an example optical link.

FIG. 1 illustrates an example optical link. In the example of FIG. 1, circuits at the transmitting side (TX) and circuits at the receiving side (RX) are coupled by an optical communication medium 101. Optical communication medium 101 may include one or more optical fibers or waveguides. At the transmitting side, a vertical-cavity surface emitting laser (VCSEL) may convert an electrical signal to an optical signal that is then transmitted via optical communication medium 101 to circuits at the receiving side. A VCSEL driver circuit (DRV) may modulate a voltage signal $V_{TX}$ and transmit the modulated signal (e.g., current pulses) to VCSEL At the receiving side, a photodiode may convert the optical signal transmitted from optical communication medium 101 to a current signal. A transimpedance amplifier (TIA) may convert and amplify the current signal to a received signal $V_{RX}$ in voltage. For example, the transimpedance amplifier may comprise an inverter and a feedback resistor.

Figure 2A:
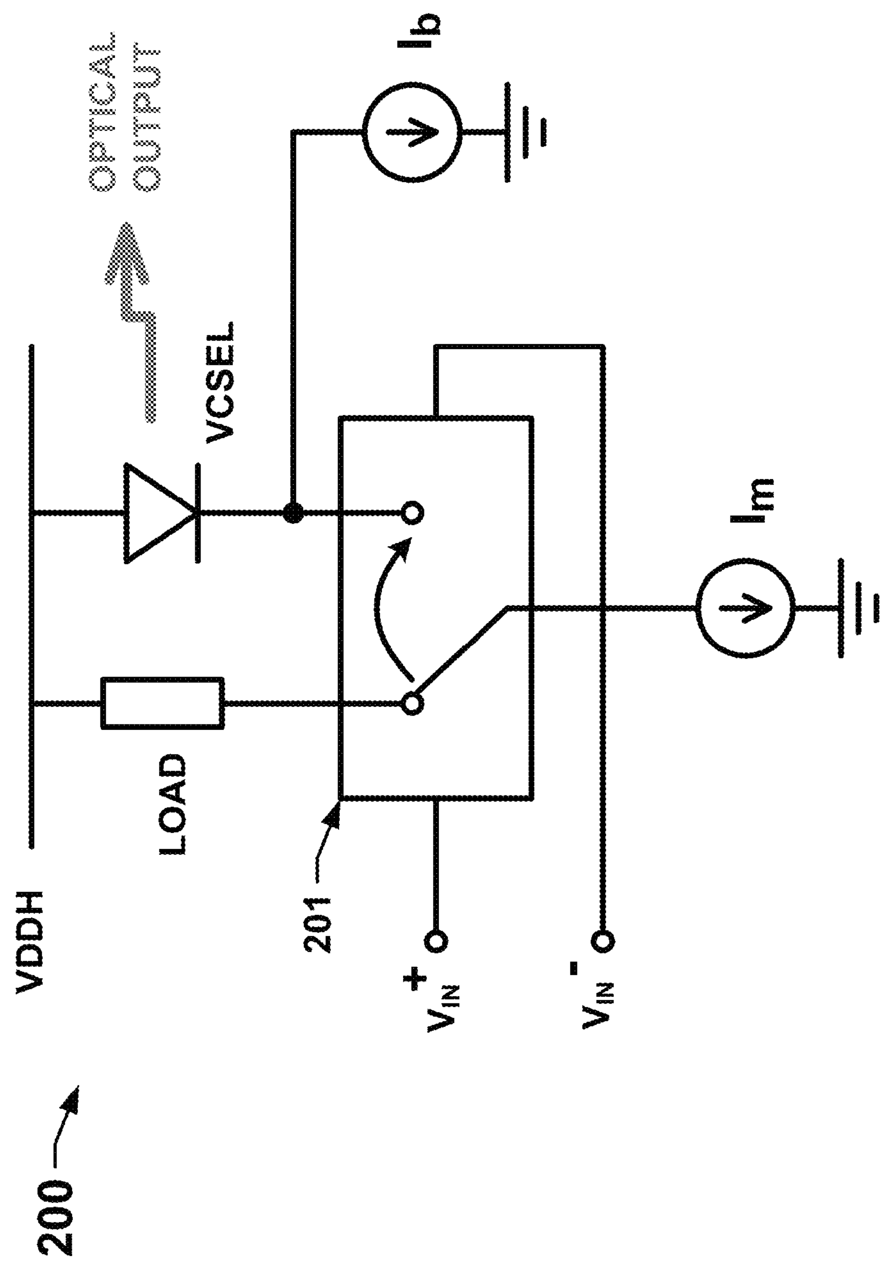
FIG. 2A illustrates a schematic drawing of an example VCSEL driver circuit.

FIG. 2A illustrates a schematic drawing of an example VCSEL driver circuit 200. In the example of FIG. 2A, the VCSEL driver circuit 200 may comprise a modulation current source $I_m$, a bias current source $I_b$, a load, and an input differential pair 201. The input differential pair 201 may steer the modulation current $I_m$ to the VCSEL during ON state (e.g., when $V_{IN}^+>V_{IN}^-$), yielding a total current of $(I_m+I_b)$ flowing through the VCSEL. The input differential pair 201 may steer the modulation current $I_m$ to the load during OFF state (e.g., when $V_{IN}^+>V_{IN}^-$), yielding a total current of $I_b$ flowing through the VCSEL. That is, the VCSEL driver circuit 200 may modulate a current provided to the VCSEL by switching between ON and OFF states (as controlled by the input signal $V_{IN}$). The load may be any suitable device that provides a voltage drop equal to that across the VCSEL illustrated in FIG. 2A. For example, the load may be a resistor $R_{load}$. The resistance value of $R_{load}$ may be chosen such that for a modulation current $I_m$, $I_m$ multiplied by $R_{load}$ equals to the voltage drop across the VCSEL. This may effectively make the drain terminals of transistor M301 and M302 equal as illustrated in FIG. 3.

Figure 2B:
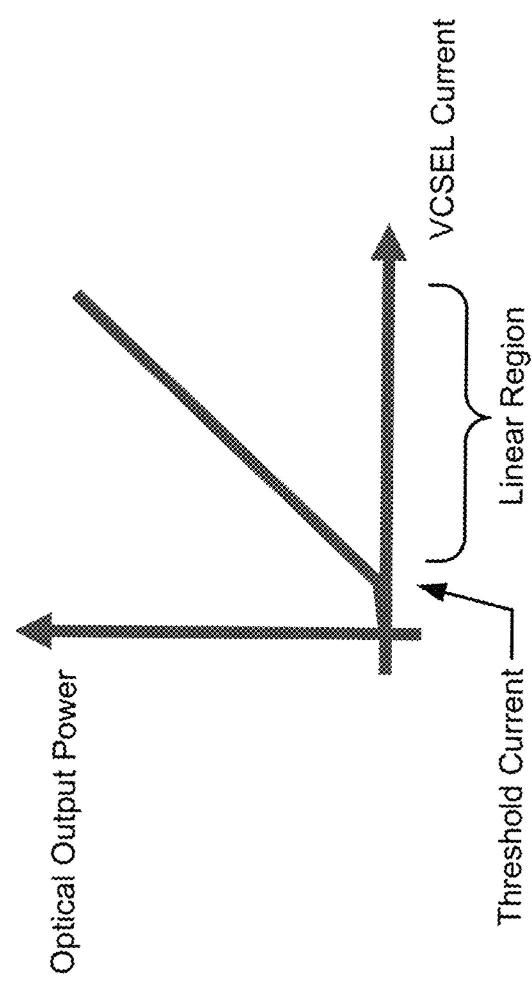
FIG. 2B illustrates an example characteristic curve of a VCSEL.

FIG. 2B illustrates an example characteristic curve of a VCSEL. It is desirable that a VCSEL has a small threshold current and a large slope efficiency (e.g., a wide linear region of the characteristic curve with a steep slope), such that the modulation amplitude of the optical output is proportional to the modulation current $I_m$. In order to efficiently deliver a modulation current to the VCSEL, the output impedance of the current source may have to be large enough to sustain the voltage variation from the VCSEL when switching between ON and OFF states. Particular embodiments describe VCSEL driver circuits with improved output impedance of its drive current source. More particularly, a VCSEL driver circuit may comprise a folded cascode transistor to provide improved output impedance.

Figure 3:
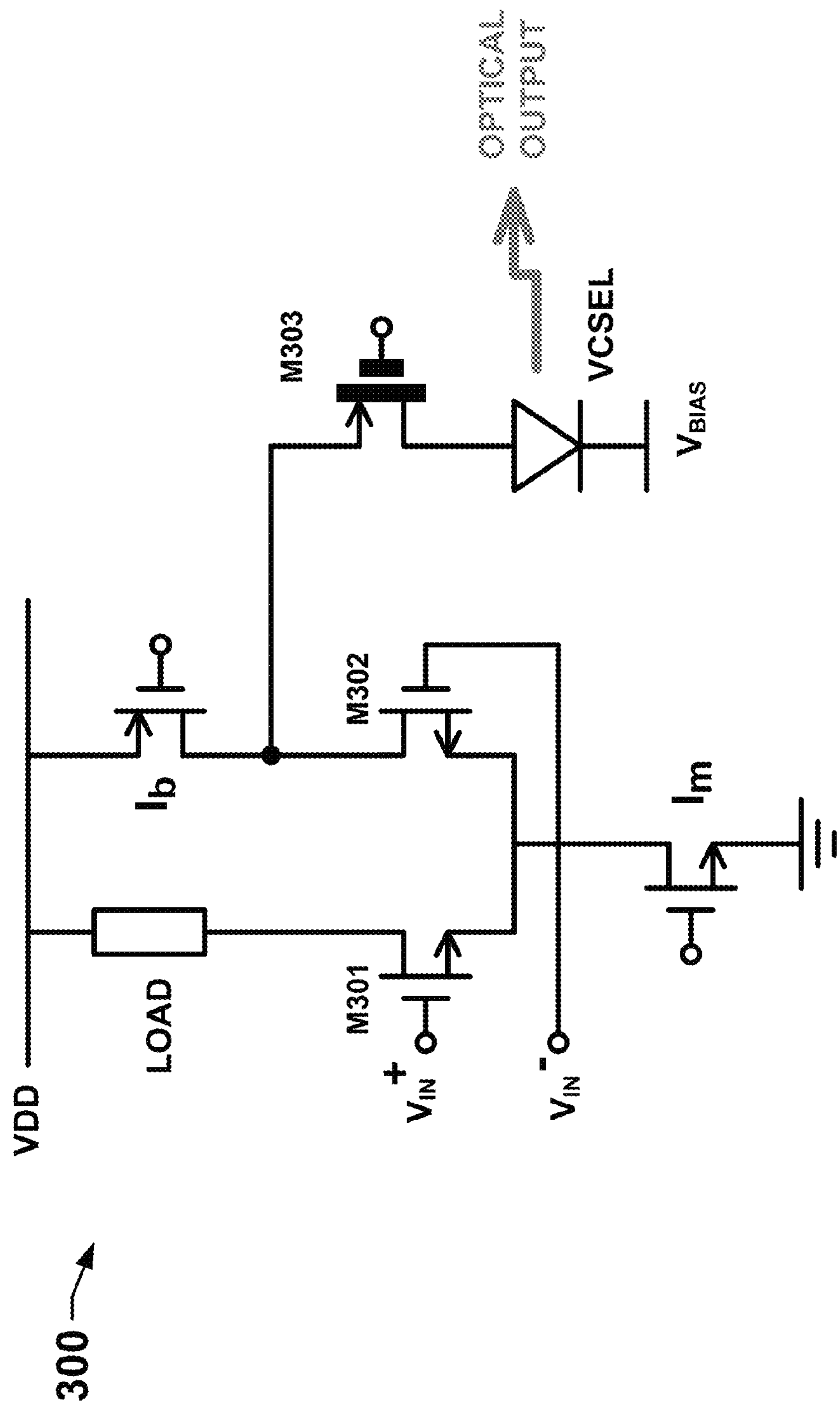
FIGS. 3-6, and 7A illustrate example VCSEL driver circuits.

FIG. 3 illustrates an example VCSEL driver circuit 300. In particular embodiments, the VCSEL driver circuit 300 may comprise a modulation current source $I_m$, a bias current source $I_b$, a load, and an input differential pair including NMOS (n-type metal-oxide-semiconductor) transistors M301 and M302 whose gates are connected respectively to positive and negative terminals of an input signal $V_{IN}$. The source terminals of the transistors M301 and M302 of the input differential pair may be connected to the modulation current source $I_m$. The drain terminal of the transistor M301 may be connected to the load. The bias current source $I_b$ may comprise a PMOS (p-type metal-oxide-semiconductor) transistor with its source terminal connected to a supply voltage. The modulation current source $I_m$ may comprise an NMOS transistor with its source terminal connected to an electrical ground. In particular embodiments, the VCSEL driver circuit 300 may also comprise a folded cascode PMOS transistor M303. The source terminal of the folded cascode transistor M303 may be connected to the bias current source $I_b$ and the drain terminal of the transistor M302 of the input differential pair. The drain terminal of the folded cascode transistor M303 may be connected to the anode terminal of VCSEL. As illustrated in FIG. 3, the VCSEL may have a common cathode configuration. The cathode terminal of the VCSEL may be connected to a bias voltage $V_{BIAS}$.

In particular embodiments, the input differential pair may steer the modulation current $I_m$ to the load during ON state, yielding a total current of $I_b$ flowing through the VCSEL. The input differential pair may "fold over" part of the bias current $I_b$ to the current source $I_m$ during OFF state, yielding a total current of $(I_b-I_m)$ flowing through the VCSEL. That is, the VCSEL driver circuit 300 may modulate a current provided to the VCSEL by switching between ON and OFF states (e.g., as controlled by the input signal $V_{IN}$). Meanwhile, the folded cascode transistor M303 may isolate the VCSEL from the bias current source $I_b$, and provide improved output impedance of the current source.

The example VCSEL driver circuit 300 may be fabricated on a semiconductor chip or device with a semiconductor fabrication process technology such as a CMOS (complementary metal-oxide-semiconductor) process technology.

This disclosure contemplates any suitable process technologies for fabricating a VCSEL driver circuit (e.g., CMOS process technology, bipolar-junction transistor or BJT process technology, and so on). A chip or device manufactured by a CMOS process technology may comprise one or more types of transistors. For example, a chip may include a first type of transistors for core computing and logic functions (e.g., instruction fetching, decoding, and executing, integer computation, floating point computation, and so on) and a second type of transistors for input/output or I/O functions. The first type of transistors may comprise thin gate oxide (e.g., about 1 nanometer for 65 nm CMOS process technology) that is optimized for computing performance with smaller operating voltages (e.g., about 1 Volt). The second type of transistors may comprise thick gate oxide (e.g., about 5 to 6 nanometers) that can sustain higher operating voltages (e.g., 2.5 Volts, 3.5 Volts) for I/O functions. In particular embodiments, the folded cascode transistor M303 may comprise the thick gate oxide for I/O functions such that the folded cascode transistor M303 may sustain the large voltage swing from the VCSEL. Other components of the example VCSEL driver circuit 300 may comprise transistors with the thin gate oxide. In other embodiments, the folded cascode transistor M303 and other components of the example VCSEL driver circuit 300 may comprises transistors with the thin gate oxide.

Figure 4:
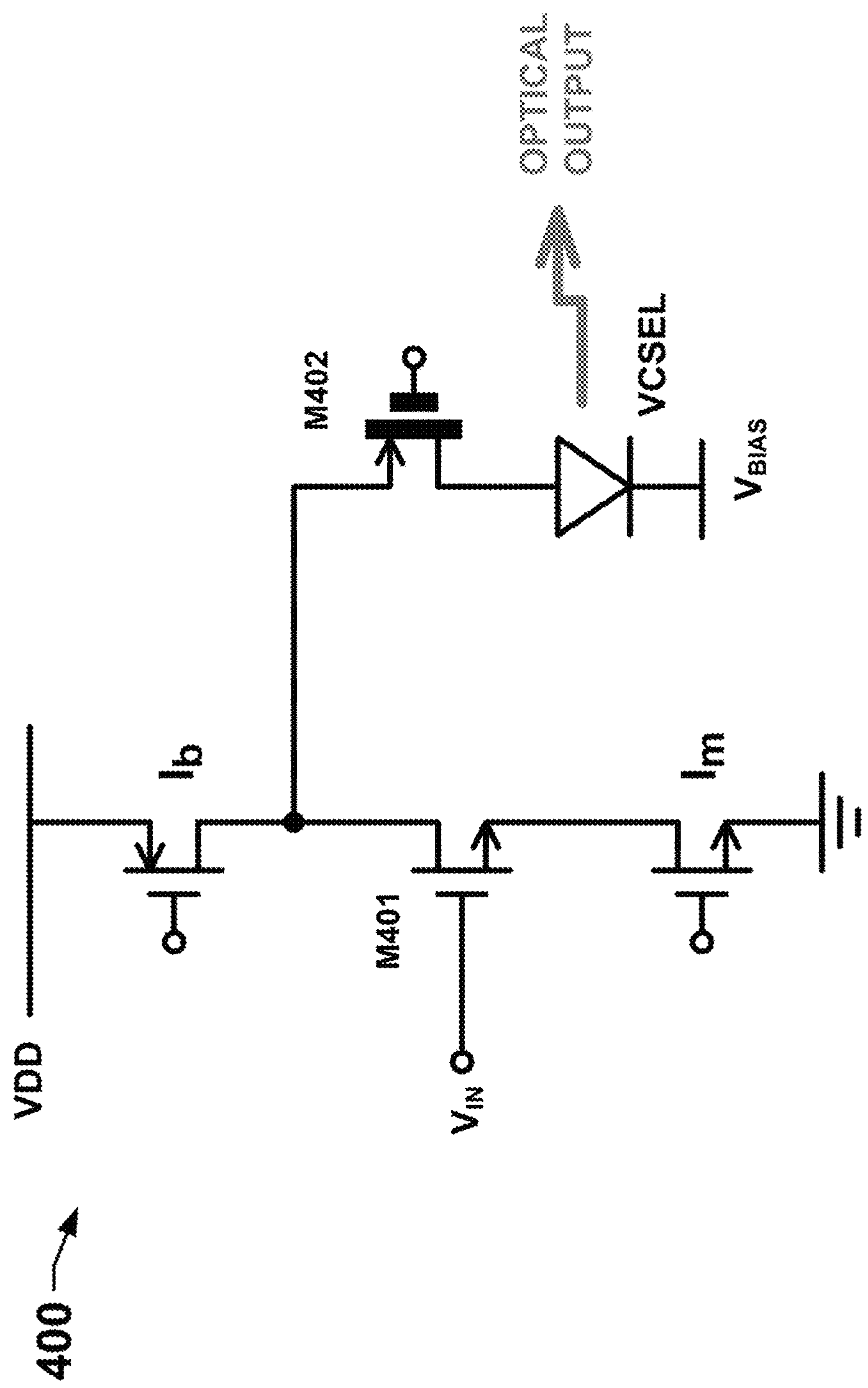

FIG. 4 illustrates an example VCSEL driver circuit 400 with a single-ended configuration. In particular embodiments, the VCSEL driver circuit 400 may comprise a modulation current source $I_m$, a bias current source $I_b$, and an input NMOS transistor M401 which gate terminal is connected to an input signal $V_{IN}$. The drain terminal of the input transistor M401 may be connected to the bias current source $I_b$. The source terminal of the input transistor M401 may be connected to the modulation current source $I_m$. The bias current source $I_b$ may comprise a PMOS transistor with its source terminal connected to a supply voltage. The modulation current source $I_m$ may comprise an NMOS transistor with its source terminal connected to an electrical ground. In particular embodiments, the VCSEL may also comprise a folded cascode PMOS transistor M402. The source terminal of the folded cascode transistor M402 may be connected to the bias current source $I_b$ and the drain terminal of the input transistor M401. The drain terminal of the folded cascode transistor M402 may be connected to the anode terminal of the VCSEL. As illustrated in FIG. 4, the VCSEL may have a common cathode configuration. The cathode terminal of the VCSEL may be connected to a biased voltage $V_{BIAS}$.

In particular embodiments, the input transistor M401 may steer the bias current $I_b$ to the folded cascode transistor M402 during OFF state, yielding a total current of $I_b$ flowing through the VCSEL. The input transistor M401 may "fold over" part of the bias current $I_b$ to the modulation current source $I_m$ during ON state, yielding a total current of $(I_b-I_m)$ flowing through the VCSEL. That is, the VCSEL driver current 400 may modulate a current provided to the VCSEL by switching between ON and OFF states (e.g., as controlled by the input signal $V_{IN}$). Meanwhile, the folded cascode transistor M402 may isolate the VCSEL from the bias current source $I_b$, and provide improved output impedance of the current source.

In particular embodiments, the folded cascode transistor M402 may comprise the thick gate oxide for I/O functions (as described earlier) such that the folded cascode transistor M402 may sustain the large voltage swing from the VCSEL. Other components of the example VCSEL driver circuit 400 may comprise transistors with the thin gate oxide (as described earlier). In other embodiments, the folded cascode transistor M402 and other components of the example VCSEL driver circuit 400 may comprise transistors with the thin gate oxide.

Figure 5:
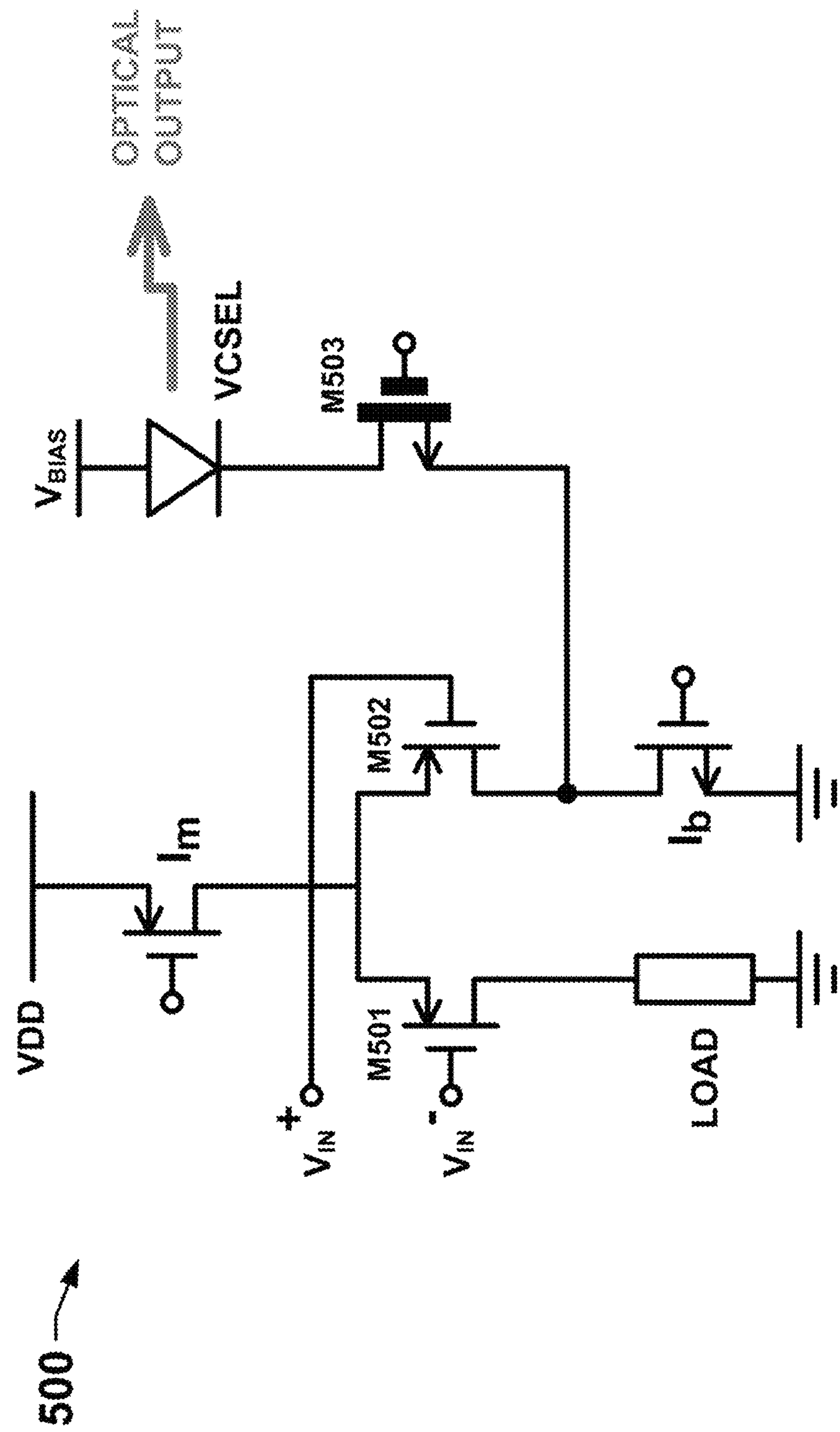

FIG. 5 illustrates an example VCSEL driver circuit 500 with a PMOS input differential pair. In particular embodiments, the VCSEL driver circuit 500 may comprise a modulation current source $I_m$, a bias current source $I_b$, a load, and an input differential pair including PMOS transistors M501 and M502 whose gates are connected respectively to positive and negative terminals of an input signal $V_{IN}$. The source terminals of the transistors M501 and M502 of the input differential pair may be connected to the modulation current source $I_m$. The drain terminal of the transistor M501 may be connected to the load. The bias current source $I_b$ may comprise an NMOS transistor with its source terminal connected to an electrical ground. The modulation current source $I_m$ may comprise a PMOS transistor with its source terminal connected to a supply voltage. In particular embodiments, the VCSEL driver circuit 500 may also comprise a folded cascode NMOS transistor M503. The source terminal of the folded cascode transistor M503 may be connected to the bias current source $I_b$ and the drain terminal of the transistor M502 of the input differential pair. The drain terminal of the folded cascode transistor M503 may be connected to the cathode terminal of VCSEL. As illustrated in FIG. 5, the VCSEL may have a common anode configuration. The anode terminal of the VCSEL may be connected to a bias voltage $V_{BIAS}$.

In particular embodiments, the input differential pair may steer the modulation current $I_m$ to the load during ON state, yielding a total current of $I_b$ flowing through the VCSEL. The input differential pair may "fold over" part of the bias current $I_b$ to the modulation current source $I_m$ during OFF state, yielding a total current of $(I_b-I_m)$ flowing through the VCSEL. That is, the VCSEL driver current 500 may modulate a current provided to the VCSEL by switching between ON and OFF states (e.g., as controlled by the input signal $V_{IN}$). Meanwhile, the folded cascode transistor M503 may isolate the VCSEL from the bias current source $I_b$, and provide improved output impedance of the current source.

In particular embodiments, the folded cascode transistor M503 may comprise the thick gate oxide for I/O functions (as described earlier) such that the folded cascode transistor M503 may sustain the large voltage swing from the VCSEL. Other components of the example VCSEL driver circuit 500 may comprise transistors with the thin gate oxide (as described earlier). In other embodiments, the folded cascode transistor M503 and other components of the example VCSEL driver circuit 500 may comprise transistors with the thin gate oxide.

Figure 6:
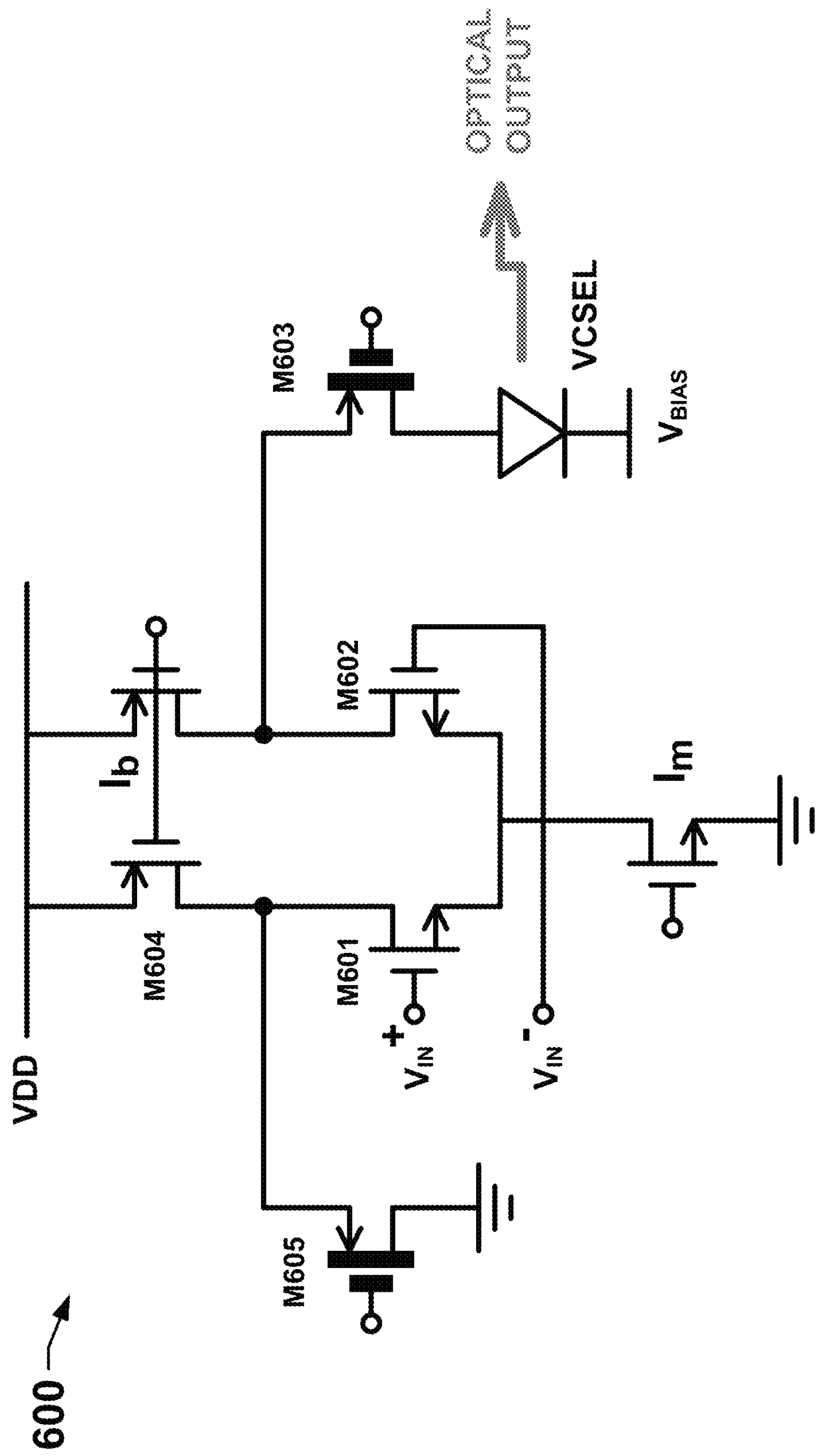

FIG. 6 illustrates an example VCSEL driver circuit 600 with a symmetrical output load. In particular embodiments, the VCSEL driver circuit 600 may comprise a modulation current source $I_m$, a bias current source $I_b$, and an input differential pair including NMOS transistors M601 and M602 whose gates are connected respectively to positive and negative terminals of an input signal $V_{IN}$. The source terminals of the transistors M601 and M602 of the input differential pair may be connected to the modulation current source $I_m$. The bias current source $I_b$ may comprise a PMOS transistor with its source terminal connected to a supply voltage. The modulation current source $I_m$ may comprise an NMOS transistor with its source terminal connected to an electrical ground. In particular embodiments, the VCSEL driver circuit 600 may also comprise a folded cascode PMOS transistor M603. The source terminal of the folded cascode transistor M603 may be connected to the bias current source $I_b$ and the drain terminal of the transistor M602 of the input differential pair. The drain terminal of the folded cascode transistor M603 may be connected to the anode terminal of VCSEL. As illustrated in FIG. 6, the VCSEL may have a common cathode configuration. The cathode terminal of the VCSEL may be connected to a bias voltage $V_{BIAS}$. Additionally, in particular embodiments, the VCSEL driver circuit 600 may comprise a PMOS transistors M604 providing a load symmetrical to the bias current source $I_b$. The transistor M604 may have a substantially same transistor sizing as the bias current source $I_b$. The VCSEL driver circuit 600 may also comprise a PMOS transistors M605 providing a load symmetrical the folded cascode transistor M603. The transistor M605 may have a substantially same transistor sizing as the folded cascode transistor M603.

In particular embodiments, the input differential pair may steer the modulation current $I_m$ to the transistors M604 and M605 during ON state, yielding a total current of $I_b$ flowing through the VCSEL. The input differential pair may "fold over" part of the bias current $I_b$ to the modulation current source $I_m$ during OFF state, yielding a total current of $(I_b-I_m)$ flowing through the VCSEL. That is, the VCSEL driver current 600 may modulate a current provided to the VCSEL by switching between ON and OFF states (e.g., as controlled by the input signal $V_{IN}$). Meanwhile, the folded cascode transistor M603 may isolate the VCSEL from the bias current source $I_b$, and provide improved output impedance of the current source. Moreover, the symmetrical load transistors M604 and M605 may reduce offset from asymmetry, such as asymmetry between the load and the bias current source as illustrated in FIG. 3. The symmetrical load may also reduce offset and improve the performance of a VCSEL driver circuit for a smaller input signal or a smaller input transistor size.

In particular embodiments, the folded cascode transistor M603 (and the symmetrical load transistor M605) may comprise the thick gate oxide for I/O functions (as described earlier) such that the transistor M603 may sustain the large voltage swing from the VCSEL. Other components of the example VCSEL driver circuit 600 may comprise transistors with the thin gate oxide (as described earlier). In other embodiments, the folded cascode transistor M603 and other components of the example VCSEL driver circuit 600 may comprise transistors with the thin gate oxide.

Figure 7A:
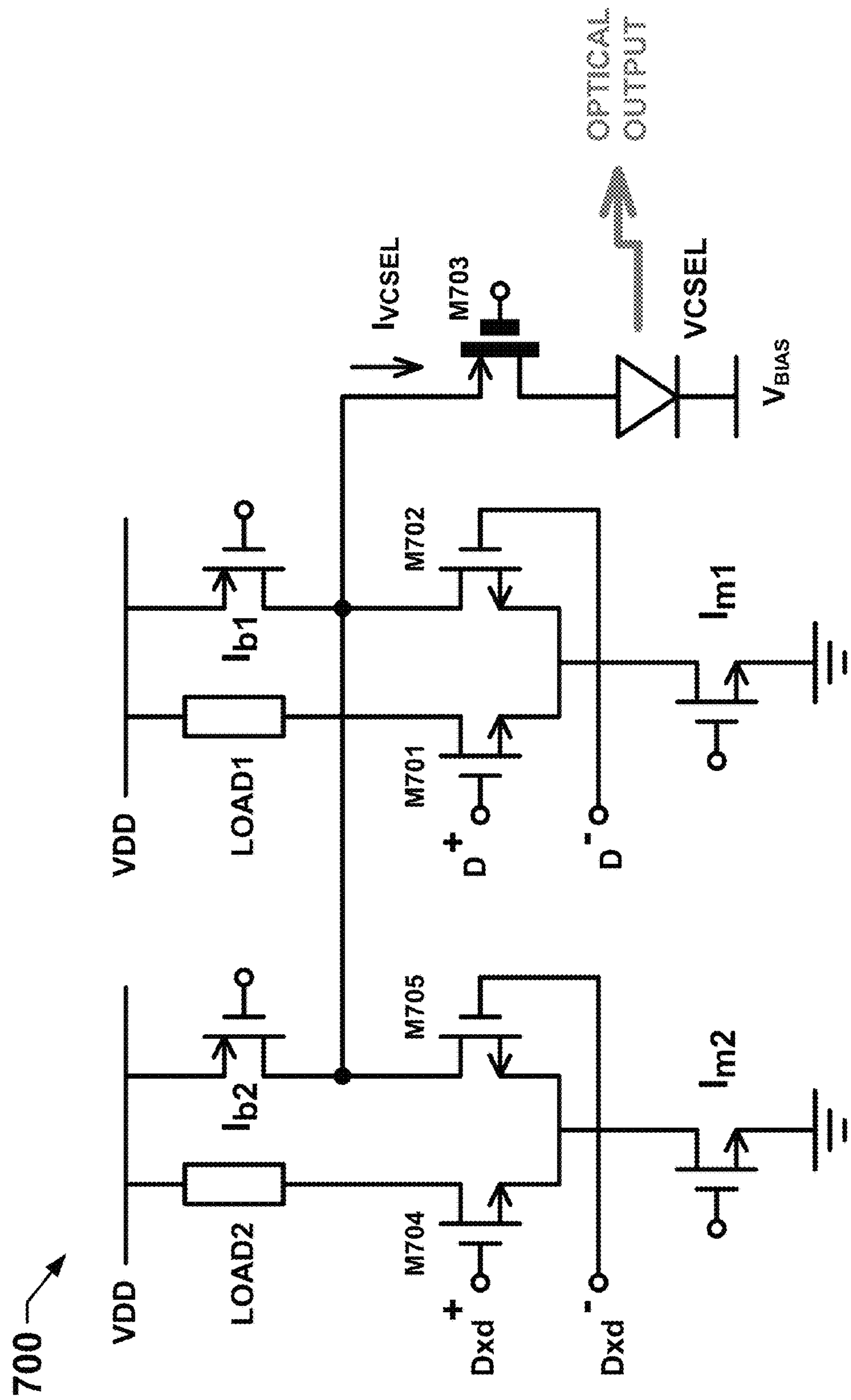

FIG. 7A illustrates an example VCSEL driver circuit 700 with pre-emphasis. In particular embodiments, the VCSEL driver circuit 700 may comprise a first modulation current source $I_{m1}$, a first bias current source $I_{b1}$, a first load (LOAD1), and a first input differential pair including NMOS transistors M701 and M702 whose gates are connected respectively to positive and negative terminals of a first input signal pair D. The source terminals of the transistors M701 and M702 of the first input differential pair may be connected to the first modulation current source $I_{m1}$. The drain terminal of the transistor M701 may be connected to the first load. The first bias $I_{b1}$ current source may comprise a PMOS transistor with its source terminal connected to a supply voltage. The first modulation current source $I_{m1}$ may comprise an NMOS transistor with its source terminal connected to an electrical ground.

In particular embodiments, the VCSEL driver circuit 700 may comprise a second modulation current source $I_{m2}$, a second bias current source $I_{b2}$, a second load (LOAD2), and a second input differential pair including NMOS transistors M704 and M705 whose gates are connected respectively to positive and negative terminals of a second input signal $D_{xd}$. The source terminals of the transistors M704 and M705 of the second input differential pair may be connected to the second modulation current source $I_{m2}$. The drain terminal of the transistor M704 may be connected to the second load. The second bias $I_{b2}$ current source may comprise a PMOS transistor with its source terminal connected to the supply voltage. The second modulation current source $I_{m2}$ may comprise an NMOS transistor with its source terminal connected to the electrical ground.

In particular embodiments, the VCSEL driver circuit 700 may also comprise a folded cascode PMOS transistor M703. The source terminal of the folded cascode transistor M703 may be connected to the first bias current source $I_{b1}$; the drain terminal of the transistor M702 of the first input differential pair, the second bias current source $I_{b2}$; and the drain terminal of the transistor M705 of the second input differential pair. The drain terminal of the folded cascode transistor M703 may be connected to the anode terminal of the VCSEL. As illustrated in FIG. 7A, the VCSEL may have a common cathode configuration. The cathode terminal of the VCSEL may be connected to a bias voltage $V_{BIAS}$.

Figure 7B:
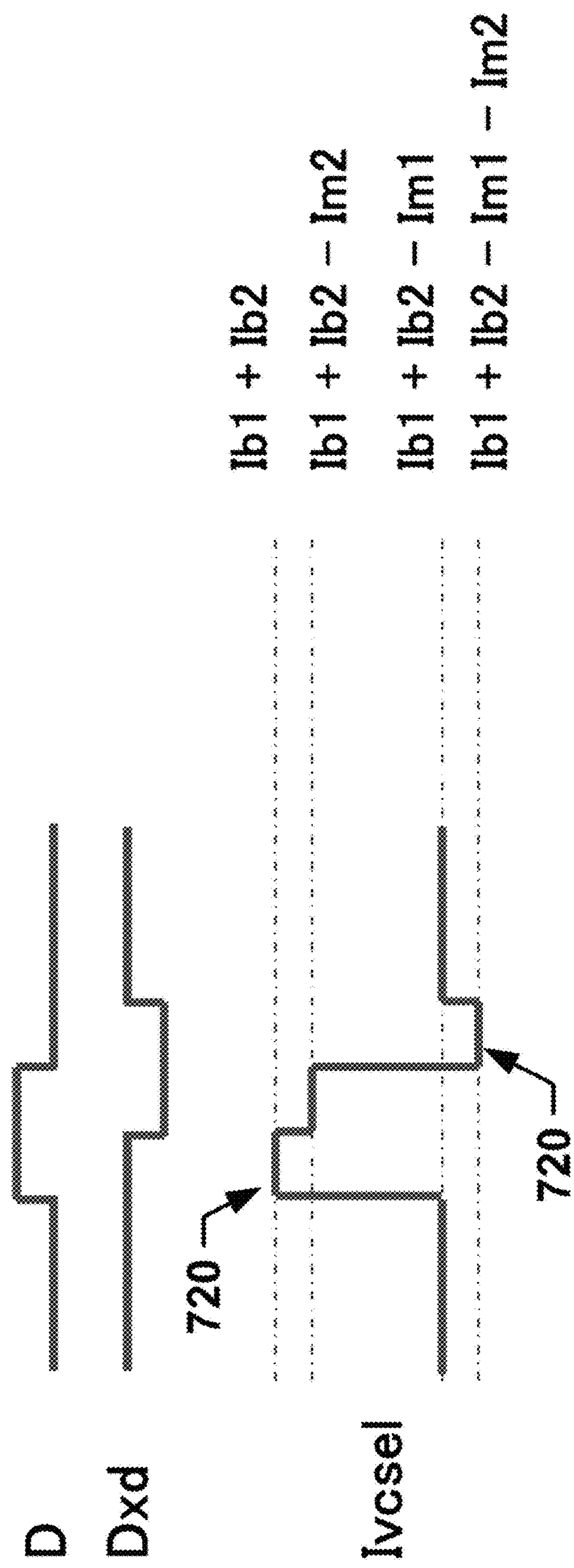
FIG. 7B illustrates example waveforms of a VCSEL driver circuit.

In particular embodiments, the second input signal $D_{xd}$ may be a delayed and inverted copy of the first input signal D. The amount of delay may be but not limited to equal to or less than one unit interval (1 UI). FIG. 7B illustrates example waveforms of the input signals and the current flowing through VCSEL ($I_{VCSEL}$) for the example VCSEL driver circuit 700 illustrated in FIG. 7A. Similar to the example VCSEL drive circuit 300 illustrated in FIG. 3, an input signal (D or $D_{xd}$) may cause the corresponding input differential pair to modulate current flowing through the VCSEL. By offsetting and inverting between the two input signals, the VCSEL driver circuit 700 may create a pre-emphasis in the resulting current flowing through the VCSEL, as illustrated by the overshoots 720 illustrated in FIG. 7B. The pre-emphasis may be canceled by a bandwidth limitation of the VCSEL, thus providing an equalization for the optical output of the VCSEL. Meanwhile, the folded cascode transistor M703 may isolate the VCSEL from the bias current sources $I_{b1}$ and $I_{b2}$, and provide improved output impedance of the current sources. Although FIG. 7A illustrates the example VCSEL driver circuit 700 with two input differential pairs, this disclosure contemplates any suitable number of input differential pairs creating pre-emphasis in the resulting current flowing through the VCSEL. Particular embodiments may provide any number of delayed or early data (e.g., delayed or early copies of an input signal) to the input differential pairs for creating pre-emphasis in the resulting current flowing through the VCSEL. Here, early data may be obtained by delaying all other inputs to the input differential pairs except for ones that are early.

In particular embodiments, the folded cascode transistor M703 may comprise the thick gate oxide for I/O functions (as described earlier) such that the folded cascode transistor M703 may sustain the large voltage swing from the VCSEL. Other components of the example VCSEL driver circuit 700 may comprise transistors with the thin gate oxide (as described earlier). In other embodiments, the folded cascode transistor M703 and other components of the example VCSEL driver circuit 700 may comprise transistors with the thin gate oxide.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are to be construed as being without limitation to such specifically recited examples and conditions. Although the embodiment(s) of the present inventions have been described in detail, it should be understood that the various changes, substitutions, and alterations could be made hereto without departing from the spirit and scope of the invention.

What is claimed is:

1. A driver circuit of a vertical-cavity surface-emitting laser (VCSEL), the driver circuit comprising:

one or more bias current sources;

one or more modulation current sources; and a switch component, the switch component being connected to the bias current sources at a first node and to the modulation current sources at one or more second nodes, and the switch component being configured to:

modulate a current from the bias and modulation current sources based on an input signal to the switch component; and provide the modulated current to the VCSEL through a folded cascode transistor, the folded cascode transistor having a first terminal connected to the switch component and the bias current sources at the first node, and the folded cascode transistor having a second terminal connected to the VCSEL.

2. The driver circuit of claim 1, wherein the folded cascode transistor comprises a metal-oxide-semiconductor (MOS) transistor, the first terminal is the source terminal of the MOS transistor, and the second terminal is the drain terminal of the MOS transistor.

3. The driver circuit of claim 2, wherein the MOS transistor comprises a thick gate oxide, the thick gate oxide being optimized for input-output functions of a device fabricated with a particular semiconductor process technology.

4. The driver circuit of claim 1, wherein the switch component comprises a differential pair of MOS transistors, the gate terminals of the MOS transistors being respectively connected to positive and negative terminals of the input signal.

5. The driver circuit of claim 4, wherein the MOS transistors comprise n-type MOS (NMOS) transistors.

6. The driver circuit of claim 4, wherein the MOS transistors comprise p-type MOS (PMOS) transistors.

7. The driver circuit of claim 1, wherein the switch component comprises a MOS transistor, the gate terminal of the MOS transistor being connected to the input signal.

8. The driver circuit of claim 1, further comprising one or more components providing symmetrical loads respectively to the bias current sources and the folded cascode transistor.

9. The driver circuit of claim 1, wherein the switch component comprises two or more pairs of MOS transistors, the gate terminals of the MOS transistors of each pair of MOS transistors being connected to positive and negative terminals of respective one of copies of the input signal, the copies of the input signal comprising one or more delayed or early copies of the input signal.

10. The driver circuit of claim 9, wherein a delayed copy is an inverted copy of the input signal being delayed by an amount of equal to or less than one unit interval.

11. A method comprising:

by a switch component of a driver circuit of a VCSEL, the driver circuit comprising one or more bias current source and one or more modulation current source, the bias current sources being connected to the switch component at a first node and to the modulation current sources at one or more second nodes, modulating a current from the bias and modulation current sources based on an input signal to the switch component; and by the switch component, providing the modulated current to the VCSEL through a folded cascode transistor, the folded cascode transistor having a first terminal connected to the switch component and the bias current sources at the first node, and the folded cascode transistor having a second terminal connected to the VCSEL.

12. The method of claim 11, wherein the folded cascode transistor comprises a metal-oxide-semiconductor (MOS) transistor, the first terminal is the source terminal of the MOS transistor, and the second terminal is the drain terminal of the MOS transistor.

13. The method of claim 12, wherein the MOS transistor comprises a thick gate oxide, the thick gate oxide being optimized for input-output functions of a device fabricated with a particular semiconductor process technology.

14. The method of claim 11, wherein the switch component comprises a differential pair of MOS transistors, the gate terminals of the MOS transistors being respectively connected to positive and negative terminals of the input signal.

15. The method of claim 14, wherein the MOS transistors comprise n-type MOS (NMOS) transistors.

16. The method of claim 14, wherein the MOS transistors comprise p-type MOS (PMOS) transistors.

17. The method of claim 11, wherein the switch component comprises a MOS transistor, the gate terminal of the MOS transistor being connected to the input signal.

18. The method of claim 11, wherein the driver circuit further comprises one or more components providing symmetrical loads respectively to the bias current sources and the folded cascode transistor.

19. The method of claim 11, wherein the switch component comprises two or more pairs of MOS transistors, the gate terminals of the MOS transistors of each pair of MOS transistors being connected to positive and negative terminals of respective one of copies of the input signal, the copies of the input signal comprising one or more delayed or early copies of the input signal.

20. The method of claim 19, wherein a delayed copy is an inverted copy of the input signal being delayed by an amount of equal to or less than one unit interval.

* * * * *